(12) United States Patent
Cherala et al.

(10) Patent No.: US 7,768,624 B2
(45) Date of Patent: *Aug. 3, 2010

(54) METHOD FOR OBTAINING FORCE COMBINATIONS FOR TEMPLATE DEFORMATION USING NULLSPACE AND METHODS OPTIMIZATION TECHNIQUES

(75) Inventors: Anshuman Cherala, Austin, TX (US); Sidlgata V. Sreenivasan, Austin, TX (US); Byung-Jin Choi, Austin, TX (US); Ecron D. Thompson, Round Rock, TX (US)

(73) Assignees: Board of Regents, The University of Texas System, Austin, TX (US); Molecular Imprints, Inc., Austin, TX (US)

( * ) Notice: Subject to any disclaimer, the term of this patent is extended or adjusted under 35 U.S.C. 154(b) by 436 days.

This patent is subject to a terminal disclaimer.

(21) Appl. No.: 11/695,469

(22) Filed: Apr. 2, 2007

(65) Prior Publication Data

US 2007/0287081 A1   Dec. 13, 2007

Related U.S. Application Data

(63) Continuation-in-part of application No. 11/143,076, filed on Jun. 2, 2005.

(60) Provisional application No. 60/788,811, filed on Apr. 3, 2006, provisional application No. 60/788,812, filed on Apr. 3, 2006, provisional application No. 60/576,570, filed on Jun. 3, 2004.

(51) Int. Cl.
  *G03F 9/00* (2006.01)
(52) U.S. Cl. .............................. 355/52; 355/53; 355/75; 355/77; 430/30

(58) Field of Classification Search ................... 355/52, 355/53, 55, 75, 77, 72, 76; 356/400, 401; 430/5, 22, 30; 378/34, 35; 264/293; 425/385
See application file for complete search history.

(56) References Cited

U.S. PATENT DOCUMENTS 3,783,520 A    1/1974   King (Continued)

FOREIGN PATENT DOCUMENTS

EP    0298425    10/1992

(Continued)

OTHER PUBLICATIONS

PCT/US05/19392 ISR, Aug. 25, 2008.

(Continued)

*Primary Examiner*—Edward J Glick
*Assistant Examiner*—Colin Kreutzer
(74) *Attorney, Agent, or Firm*—Laura C. Robinson

(57) ABSTRACT

The present invention is directed towards a method for determining deformation parameters that a patterned device would undergo to minimize dimensional variations between a recorded pattern thereon and a reference pattern, the method including, inter alia, comparing spatial variation between features of the recorded pattern with respect to corresponding features of the reference pattern; and determining deformation forces to apply to the patterned device to attenuate the dimensional variations, with the forces having predetermined constraints, wherein a summation of a magnitude of the forces is substantially zero and a summation of moment of the forces is substantially zero.

5 Claims, 4 Drawing Sheets

U.S. PATENT DOCUMENTS

| | | | |
|---|---|---|---|
| 4,202,681 A | | 5/1980 | McMaster et al. |
| 4,326,805 A | | 4/1982 | Feldman et al. |
| 4,356,018 A | | 10/1982 | McMaster |
| 4,487,623 A | | 12/1984 | Claassen et al. |
| 4,600,309 A | | 7/1986 | Fay |
| 4,848,911 A | | 7/1989 | Uchida et al. |
| 4,865,639 A | | 9/1989 | Kudo |
| 4,877,437 A | | 10/1989 | Nitschke |
| 4,929,083 A | | 5/1990 | Brunner |
| 5,072,126 A | | 12/1991 | Progler |
| 5,074,667 A | | 12/1991 | Miyatake |
| 5,148,036 A | | 9/1992 | Matsugu et al. |
| 5,148,037 A | | 9/1992 | Suda et al. |
| 5,171,490 A | | 12/1992 | Fudim |
| 5,204,739 A | | 4/1993 | Domenicali |
| 5,218,193 A | | 6/1993 | Miyatake |
| 5,331,371 A | | 7/1994 | Mori et al. |
| 5,355,219 A | | 10/1994 | Araki et al. |
| 5,414,514 A | | 5/1995 | Smith et al. |
| 5,452,090 A | | 9/1995 | Progler et al. |
| 5,477,058 A | | 12/1995 | Sato |
| 5,504,793 A | | 4/1996 | Chen |
| 5,508,527 A | | 4/1996 | Kuroda et al. |
| 5,534,073 A | | 7/1996 | Kinoshita et al. |
| 5,633,505 A | | 5/1997 | Chung et al. |
| 5,682,228 A | * | 10/1997 | Miyake ............ 355/75 |
| 5,726,548 A | | 3/1998 | Chiba et al. |
| 5,737,064 A | | 4/1998 | Inoue et al. |
| 5,740,699 A | | 4/1998 | Ballantyne et al. |
| 5,785,918 A | | 7/1998 | Hull |
| 5,808,742 A | | 9/1998 | Everett et al. |
| 5,854,819 A | | 12/1998 | Hara et al. |
| 5,876,550 A | | 3/1999 | Feygin et al. |
| 5,877,036 A | | 3/1999 | Kawai |
| 5,877,861 A | | 3/1999 | Ausschnitt et al. |
| 5,962,859 A | | 10/1999 | Groves et al. |
| 5,999,245 A | | 12/1999 | Suzuki |
| 6,032,549 A | | 3/2000 | Tokio et al. |
| 6,049,373 A | | 4/2000 | Miyatake |
| 6,088,103 A | | 7/2000 | Everett et al. |
| 6,150,231 A | | 11/2000 | Muller et al. |
| 6,153,886 A | | 11/2000 | Hagiwara et al. |
| 6,285,439 B1 | | 9/2001 | Miyatake |
| 6,295,120 B1 | | 9/2001 | Miyatake |
| 6,383,888 B1 | | 5/2002 | Stirton |
| 6,388,755 B1 | | 5/2002 | Zhao |
| 6,420,892 B1 | | 7/2002 | Krivy et al. |
| 6,489,068 B1 | | 12/2002 | Kye |
| 6,522,411 B1 | | 2/2003 | Moon et al. |
| 6,575,676 B2 | | 6/2003 | Wang et al. |
| 6,580,505 B1 | | 6/2003 | Bareket |
| 6,630,410 B2 | | 10/2003 | Trapp et al. |
| 6,636,311 B1 | | 10/2003 | Ina et al. |
| 6,665,119 B1 | | 12/2003 | Kurtz et al. |
| 6,696,220 B2 | | 2/2004 | Bailey et al. |
| 6,791,669 B2 | | 9/2004 | Poon |
| 6,808,344 B2 | | 10/2004 | Chen |
| 6,809,802 B1 | | 10/2004 | Tsukamoto et al. |
| 6,819,426 B2 | | 11/2004 | Sezginer et al. |
| 6,873,087 B1 | | 3/2005 | Choi et al. |
| 6,902,853 B2 | | 6/2005 | Sreenivasan et al. |
| 6,921,615 B2 | | 7/2005 | Sreenivasan et al. |
| 6,922,906 B2 | | 8/2005 | Choi et al. |
| 6,936,194 B2 | | 8/2005 | Watts |
| 6,951,173 B1 | | 10/2005 | Meissl et al. |
| 6,954,275 B2 | | 10/2005 | Choi et al. |
| 6,955,868 B2 | | 10/2005 | Choi et al. |
| 6,986,975 B2 | | 1/2006 | Sreenivasan et al. |
| 7,027,156 B2 | | 4/2006 | Watts et al. |
| 7,070,405 B2 | | 7/2006 | Sreenivasan et al. |
| 7,098,572 B2 | | 8/2006 | Choi et al. |
| 7,150,622 B2 | | 12/2006 | Choi et al. |
| 7,186,483 B2 | | 3/2007 | Sreenivasan et al. |
| 7,473,090 B2 | | 1/2009 | McMackin et al. |
| 2001/0023042 A1 | | 9/2001 | Dirksen et al. |
| 2002/0069525 A1 | | 6/2002 | Hada et al. |
| 2002/0150398 A1 | | 10/2002 | Choi et al. |
| 2003/0081193 A1 | | 5/2003 | White et al. |
| 2003/0112421 A1 | | 6/2003 | Smith |
| 2003/0223079 A1 | | 12/2003 | Hill |
| 2004/0033515 A1 | | 2/2004 | Cao et al. |
| 2004/0065252 A1 | | 4/2004 | Sreenivasan et al. |
| 2004/0065976 A1 | | 4/2004 | Sreenivasan et al. |
| 2004/0141163 A1 | | 7/2004 | Bailey et al. |
| 2004/0149687 A1 | | 8/2004 | Choi et al. |
| 2005/0051742 A1 | | 3/2005 | Shiraishi |
| 2005/0260295 A1 | | 11/2005 | Choi et al. |
| 2005/0264132 A1 | | 12/2005 | Choi et al. |
| 2005/0271955 A1 | | 12/2005 | Cherala et al. |
| 2005/0274219 A1 | | 12/2005 | Choi et al. |
| 2005/0275251 A1 | | 12/2005 | Choi et al. |
| 2005/0275311 A1 | | 12/2005 | Choi et al. |
| 2006/0005657 A1 | | 1/2006 | Choi et al. |
| 2006/0019183 A1 | | 1/2006 | Voisin |
| 2006/0114450 A1 | | 6/2006 | Nimmakayala et al. |
| 2006/0115999 A1 | | 6/2006 | Sreenivasan et al. |
| 2006/0126058 A1 | | 6/2006 | Nimmakayala et al. |
| 2006/0158651 A1 | | 7/2006 | Watts et al. |
| 2007/0170617 A1 | | 7/2007 | Choi et al. |
| 2008/0308971 A1 | | 12/2008 | Liu et al. |

FOREIGN PATENT DOCUMENTS

| | | |
|---|---|---|
| EP | 0411032 | 5/1994 |
| EP | 0581620 | 2/1998 |
| EP | 0839769 | 1/2002 |
| EP | 0872456 | 1/2002 |
| JP | 55-88332 | 7/1980 |
| JP | 63-165118 | 7/1988 |
| JP | 1-234213 | 9/1989 |
| JP | 11-060255 | 3/1999 |
| WO | WO 02/064519 | 8/2002 |

OTHER PUBLICATIONS

Arai et al., Development of a New Parallel Manipulator with Fixed Linear Actuator, In Proceedings of Japan/USA Symposium on Flexible Automation, vol. 1, ASME, New York, pp. 145-149 Jan. 1, 1996.

Williams et al., Six Degree of Freedom Mag-Lev Stage Development, SPIE vol. 3051, 856-867 Jan. 1, 1997.

Wang et al., Passive Compliance versus Active Compliance in Robot-Based Automated Assembly Systems, Industrial Robot vol. 25, No. 1, pp. 48-57 Jan. 1, 1998.

Rong et al., Design and Analysis of Flexure-Hinge Mechanism Used in Micro-Positioning Stages, ASME vol. 2, pp. 979-985 Jan. 1, 1994.

Mansky et al., Large-Area Domain Alignment in Block Copolymer Thin Films Using Electric Fields, Macromolecules. vol. 31. No. 13, pp. 4399-4401 Jun. 9, 1998.

White et al., Novel Alignment System for Imprint Lithography, J. Vac. Sci. Technol. B 18(6), pp. 3552-3556 Nov. 1, 2000.

Uchida et al., A Mask-to-Wafer Alignment and Gap Setting Method for X-ray Lithography Using Gratings, J. Vac. Sci. Technol. B 9 (6), pp. 3202-3206 Nov. 1, 1991.

Abstract of Japanese Patent 55-88332, Apr. 14, 2004.

Armitage et al., Analysis of Overlay Distortion Patterns, SPIE vol. 921 Integrated Circuit Metrology, Inspection, and Process Control II (1988) Jan. 1, 1988.

Moon et al., Interferometric-Spatial-Phase Imaging for Six-Axis Mask Control, MIT NanoStructures Laboratory, Research Laboraty of Electronics Oct. 17, 2003.

Chen et al., Adaptive Alignment of Photomasks for Overlay Placement, Journal of Vacuum Science. B 20(6), pp. 3099-3105 Nov. 1, 2002.

Wronosky et al., Wafer and Reticle Positioning System for the Extreme Ultraviolet Lithography Engineering Test Stand, Emerging Lithography Technologies, Proceedings of SPIE vol. 3997, pp. 829-839 Jul. 1, 2000.

Park et al., Aligning Liquid Crystals Using Replicated Nanopatterns, PSI Scientific Report 2002, vol. VII, p. 85 Mar. 1, 2003.

Deng et al., Simulation of Exposure and Alignment for Nano-imprint Lithography, Proc. SPIE, vol. 4688-93, p. 842-849 Jan. 1, 2002.

Deng et al., Rigorous Electromagnetic Simulation Applied to Alignment Systems, Proc. SPIE, vol. 4346-164, p. 1533-1540 Jan. 1, 2001.

Choi et al., Distortion and Overlay Performance of UV Step and Repeat Imprint Lithography, MNE Micro- and Nano-Engineering Conference Sep. 1, 2004.

Nordquist et al., Image Placement Issues for ITO-based Step and Flash Imprint Lithography Templates, J. Vac. Sci. Technol. B, pp. 695-701 Mar. 1, 2004.

Gehoski et al., Evaluation of the Imprio 100 Step and Flash Imprint Lithography Tool, Proceedings of SPIE, vol. 5374, pp. 1006-1016 May 1, 2004.

Choi et al., Layer-to-Layer Alignment for Step and Flash Imprint Lithography, SPIE's 26th Intl. Symp. Microlithography: Emerging Lithographic Technologies, Santa Clara, CA Mar. 1, 2001.

Sreenivasan et al., U.S. Appl. No. 11/373,533, entitled Alignment Systems for Imprint Lithography, filed Mar. 10, 2006.

Cherala et al., U.S. Appl. No. 11/687,902, entitled System to Vary Dimensions of a Thin Template, filed Mar. 19, 2007.

Sreenivasan et al., U.S. Appl. No. 11/695,850, entitled Method of concurrently patterning a substrate having a plurality of fields and a plurality of alignment marks, filed Apr. 3, 2007.

Nimmakayala et al., U.S. Appl. No. 11/694,644, entitled Enhanced Multi Channel Alignment, filed Mar. 30, 2007.

Shackleton et al., U.S. Appl. No. 11/694,193, entitled Preserving Filled Features when Vacuum Wiping, filed Mar. 30, 2007.

Farhadinia, Finite Element Analysis and Experimental Evaluation of Buckling Phenomena in Laminated Composite Tubes and Plates, Diss. Abstr. Int. Jan. 1, 1992.

Anisovich et al., Penetration of Gases into Metal in Gating Systems, Kokl. Akad. Nauk Bearusi Mar. 1, 1984.

Abstract of Japanese Patent 11-060255, Mar. 2, 1999.

Abstract of Japanese Patent 1-234213, Sep. 19, 1989.

Abstract of Japanese Patent 63-165118, Jul. 8, 1988.

Zhang et al., Novel Room-Temperature First Level Packaging Process for Microscale Devices, in Eruosensors XVIII 2004—The 18th European conference on Solid-State Transducers—Sensor and Actuators A, Physical, vol. 123-124C, p. 646-654 Sep. 30, 2005.

* cited by examiner

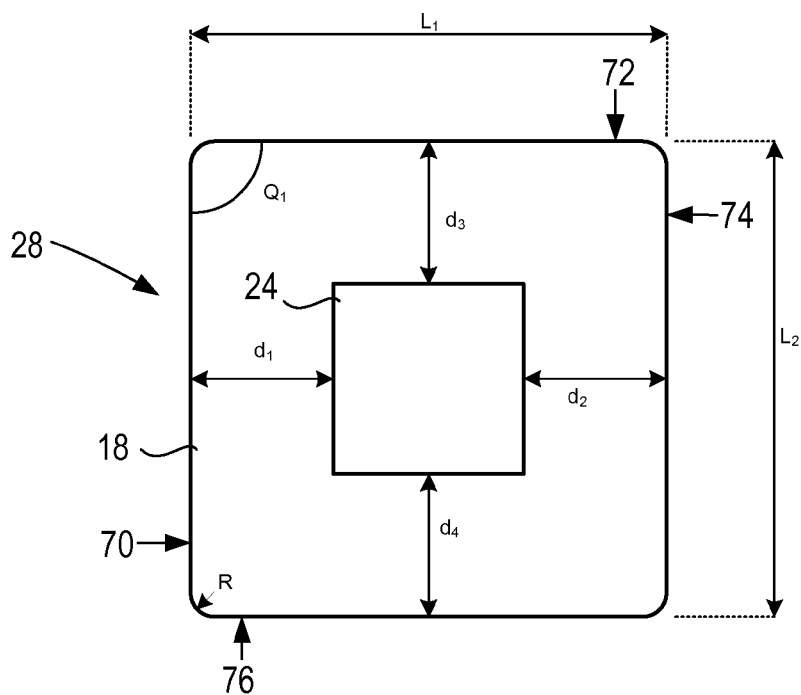
FIG. 6
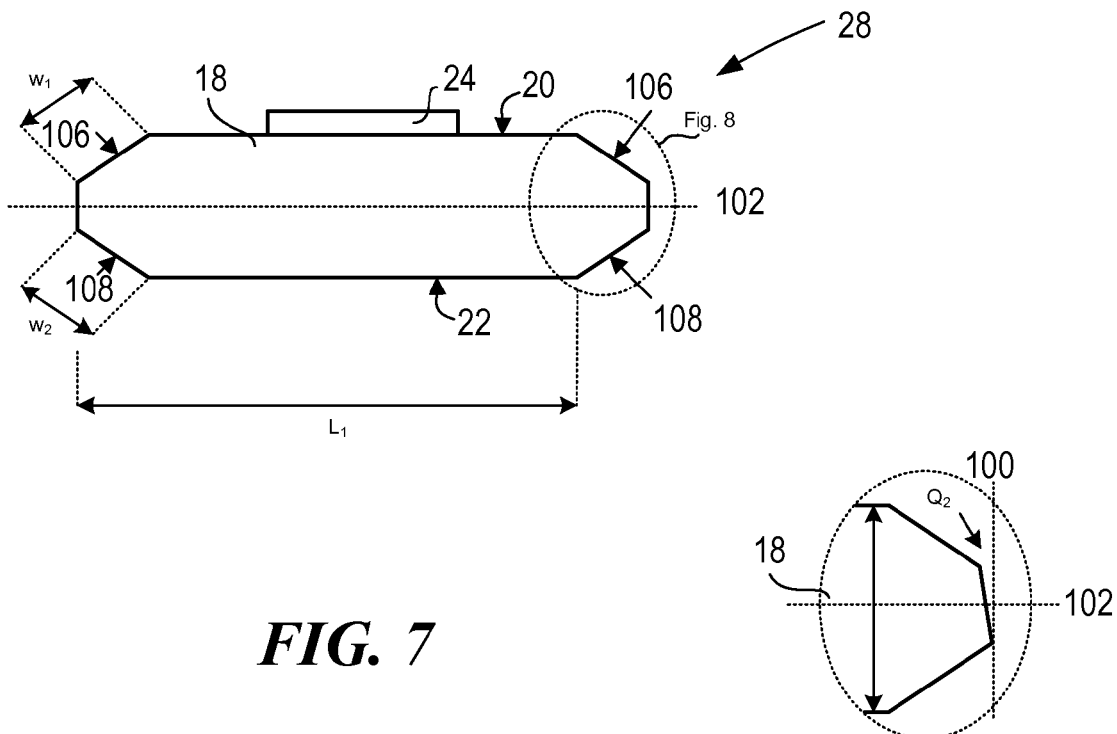
FIG. 7
FIG. 8

METHOD FOR OBTAINING FORCE COMBINATIONS FOR TEMPLATE DEFORMATION USING NULLSPACE AND METHODS OPTIMIZATION TECHNIQUES

CROSS-REFERENCE TO RELATED APPLICATIONS

The present application claims priority to U.S. Provisional Application No. 60/788,811, filed on Apr. 3, 2006, entitled "Solutions for Force Combinations for Template Deformation using Nullspace Method and Optimization Techniques" and U.S. Provisional Application No. 60/788,812, filed on Apr. 3, 2006, entitled "Template Geometric Design for Max and Match Nano Imprint Lithography Processes"; and is a Continuation-in-Part of U.S. patent application Ser. No. 11/143,076, filed on Jun. 2, 2005, entitled "System and Method for Improvement of Alignment and Overlay for Microlithography" which claims priority to U.S. Provisional Application No. 60/576,570, filed on Jun. 3, 2004 entitled "System and Method for Improvement of Alignment and Overlay for Microlithography", all of which are incorporated herein by reference.

STATEMENT REGARDING FEDERALLY SPONSORED RESEARCH OR DEVELOPMENT

The United States government has a paid-up license in this invention and the right in limited circumstance to require the patent owner to license others on reasonable terms as provided by the terms of 70NANB4H3012 awarded by National Institute of Standards (NIST) ATP Award and N66001-06-C-2003 awarded by Nanoimprint Lithography Manufacturing Scale (NIMS) Award.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a stage to obtain a desired position to facilitate patterning thereof. To that end, a mold is employed spaced-apart from the substrate with a formable liquid present between the mold and the substrate. The liquid is solidified to form a patterned layer that has a pattern recorded therein that is conforming to a shape of the surface of the mold in contact with the liquid. The mold is then separated from the patterned layer such that the mold and the substrate are spaced-apart. The substrate and the patterned layer are then subjected to processes to transfer, into the substrate, a relief image that corresponds to the pattern in the patterned layer.

BRIEF DESCRIPTION OF THE DRAWINGS

FIG. 6 is a top down view of the template shown in FIG. 1;

FIG. 7 is a side view of the template shown in FIG. 1; and

FIG. 8 is a exploded view of a portion of the template shown in FIG. 7.

DETAILED DESCRIPTION

Figure 1:
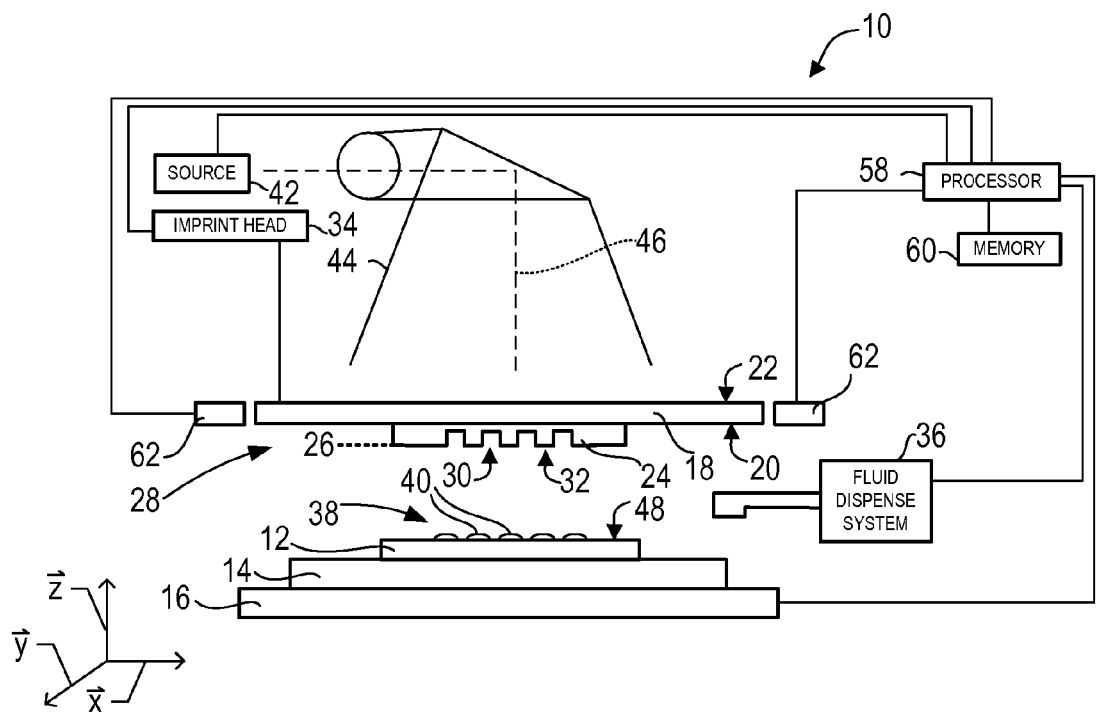
FIG. 1 is a simplified side view of a lithographic system having a template spaced-apart from a substrate.

Referring to FIG. 1, a system 10 to form a relief pattern on a substrate 12 is shown. Substrate 12 may be coupled to a substrate chuck 14. Substrate chuck 14 may be any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes," which is incorporated herein by reference. Substrate 12 and substrate chuck 14 may be supported upon a stage 16. Further, stage 16, substrate 12, and substrate chuck 14 may be positioned on a base (not shown). Stage 16 may provide motion about the x and y axes.

Spaced-apart from substrate 12 is a template 18 having first and second opposed sides 20 and 22. Positioned on first side 20 of template 18 is a mesa 24 extending therefrom towards substrate 12 with a patterning surface 26 thereon. Further, mesa 24 may be referred to as a mold 24. Mesa 24 may also be referred to as a nanoimprint mold 24. In a further embodiment, template 18 may be substantially absent of mold 24. Template 18 and/or mold 24 may be formed from such materials including but not limited to, fused-silica, quartz, silicon, organic polymers, siloxane polymers, borosilicate glass, fluorocarbon polymers, metal, and hardened sapphire. In a further embodiment, template 18 and mold 24 may be commonly referred to as patterned device 28. As shown, patterning surface 24 comprises features defined by a plurality of spaced-apart recesses 30 and protrusions 32. However, in a further embodiment, patterning surface 24 may be substantially smooth and/or planar. Patterning surface 24 may define an original pattern that forms the basis of a pattern to be formed on substrate 12.

Template 18 may be coupled to a template chuck (not shown), the template chuck (not shown) being any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes." Template 18 may be coupled to an imprint head 34 to facilitate movement of template 18 and mold 26. In a further embodiment, the template chuck (not shown) may be coupled to imprint head 34 to facilitate movement of template 18 and mold 26.

System 10 further comprises a fluid dispense system 36. Fluid dispense system 36 may be in fluid communication with substrate 12 so as to deposit a polymeric material 38 thereon. System 10 may comprise any number of fluid dispensers and fluid dispense system 36 may comprise a plurality of dispensing units therein. Polymeric material 38 may be positioned upon substrate 12 using any known technique, e.g., drop dispense, spin-coating, dip coating, chemical vapor deposition (CVD), physical vapor deposition (PVD), thin film deposition, thick film deposition, and the like. As shown, polymeric material 38 may be deposited upon substrate 12 as a plurality of spaced-apart droplets 40. Typically, polymeric material 38 is disposed upon substrate 12 before the desired volume is defined between mold 24 and substrate 12. However, polymeric material 38 may fill the volume after the desired volume has been obtained.

Figure 2:
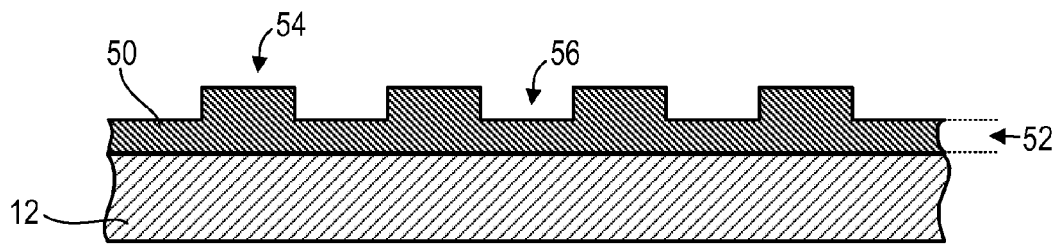
FIG. 2 is a simplified side view of the substrate shown in FIG. 1, having a patterned layer positioned thereon.

Referring to FIGS. 1 and 2, system 10 further comprises a source 42 of energy 44 coupled to direct energy 44 along a path 46. Imprint head 34 and stage 16 are configured to arrange mold 24 and substrate 12, respectively, to be in superimposition and disposed in path 46. Either imprint head 34, stage 16, or both vary a distance between mold 24 and substrate 12 to define a desired volume therebetween such that mold 24 contacts polymeric material 38 and the desired volume is filled by polymeric material 38. More specifically, polymeric material 38 of droplets 40 may ingress and fill recesses 30 of mold 24. After the desired volume is filled with polymeric material 38, source 42 produces energy 44, e.g., broadband ultraviolet radiation that causes polymeric material 38 to solidify and/or cross-link conforming to the shape of a surface 48 of substrate 12 and patterning surface 26, defining a patterned layer 50 on substrate 12. Patterned layer 50 may comprise a residual layer 52 and a plurality of features shown as protrusions 54 and recessions 56. System 10 may be regulated by a processor 58 that is in data communication with stage 16, imprint head 34, fluid dispense system 36, and source 42, operating on a computer readable program stored in memory 60.

Figure 3:
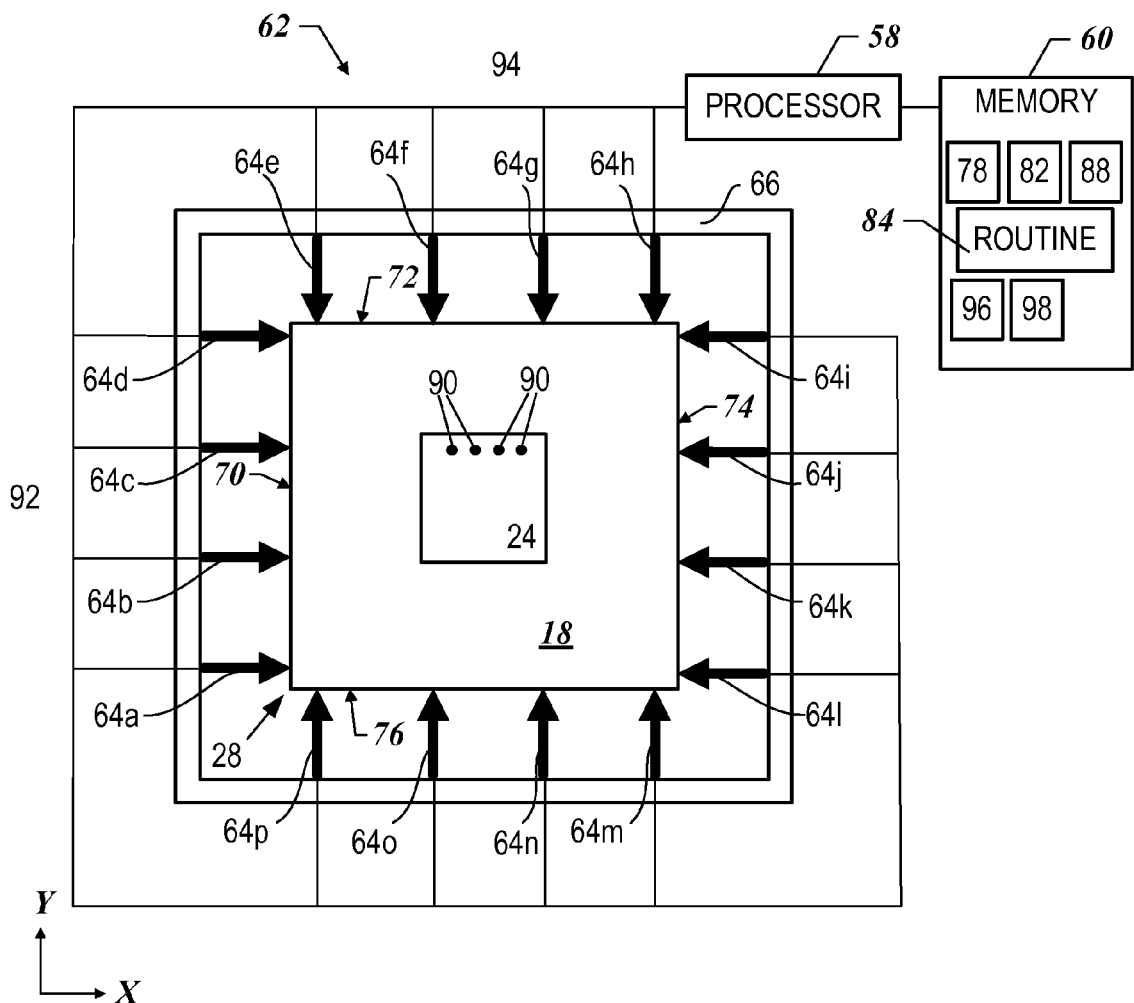
FIG. 3 is a simplified plan view of a holder for the template, both shown in FIG. 1, in accordance with the present invention.

Referring to FIGS. 1 and 3, system 10 further comprises an actuator system 62 surrounding patterned device 28 to facilitate alignment and overlay registration. To that end, actuation system 62 includes a plurality of actuators 64 coupled between a frame 66 and patterned device 20. Each of actuators 64 are arranged to facilitate generation of a force on one of the four sides 70, 72, 74 and 76 of patterned device 28.

As shown, actuator system 62 comprises sixteen actuators 64a-62p coupled to patterned device 20. More specifically, coupled to side 70 of template 18 are actuators 64a-64d; coupled to side 72 of template 18 are actuators 64e-64h; coupled to side 74 of template 18 are actuators 64i-64l; and coupled to side 76 of template 18 are actuators 64m-64p. In a further embodiment, template 18 may have any number of actuators 64 coupled thereto and may have differing number of actuators 64 coupled to each side of template 18. Template 18 may have any configuration and number of actuators 64 positioned on sides 70, 72, 74, and 76 thereof. Actuation system 62 may be in data communication with processor 58, operating on a computer readable program stored in memory 60, to control an operation thereof, and more specifically, generate control signals that are transmitted to actuators 64 of actuation system 62.

Actuation system 62 facilitates alignment and overlay registration by selectively deforming patterned device 20. This facilitates correcting various parameters of the pattern shape, i.e., magnification characteristics, skew/orthogonality characteristics, and trapezoidal characteristics. Magnification characteristics may be magnification error, such as where the overall pattern changes from a square shape to a rectangular shape. Skew/orthogonality characteristics may be skew/orthogonality error where adjacent edges form an oblique or obtuse angle with respect to one another instead of an orthogonal angle. Trapezoidal characteristics may be trapezoidal error where as in where a square/rectangular assumes the shape of a trapezium, with trapezium including a trapezoid. To control the pattern shape, patterned device 20 may be selectively deformed by actuators 64 to minimize, if not cancel, the distortions present, thereby reducing overlay errors. To that end, patterned device 20 is inspected employing known image placement or image registration systems, e.g., LMS IPRO3 available from Leica Microsystems of Bannockburn, Ill.

Figure 4:
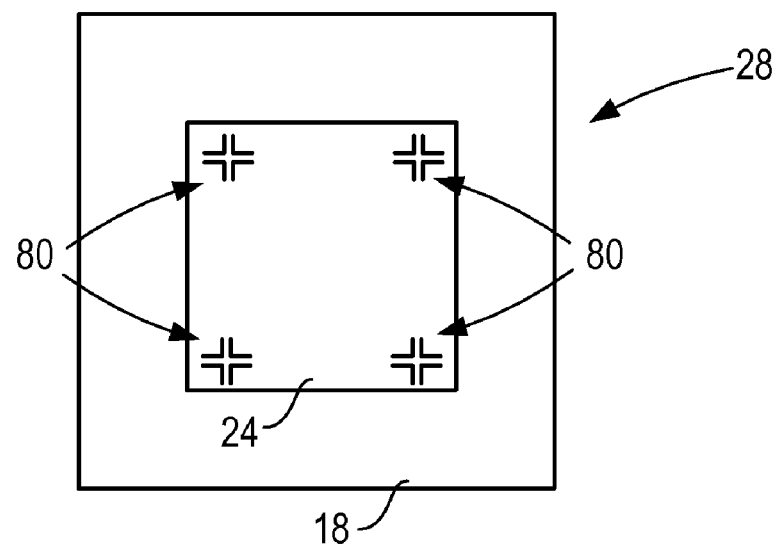
FIG. 4 is a simplified plan view of the template shown in FIG. 1, having a plurality of alignment marks.

Referring to FIGS. 1, 3 and 4, measured information 78 concerning the location of the features on patterned device 20 would be mapped into memory 60. The features that measured information 78 represents are reference marks present on patterned device 20 to facilitate overlay and alignment techniques. The features may include any known alignment mark, such as box-in-box; cross-in-cross and/or vernier scale marks, referred to as overlay features. The overlay features are usually positioned at differing regions of patterned device 20 as room permits and are arranged in a polygonal, if not rectangular grid. As shown in FIG. 4, alignment marks 80 are positioned in the corners of mold 24.

Referring to FIGS. 1 and 3, loaded into memory 60 would be reference information 82 against which measured information 78 would be compared. Reference information 82 would include information concerning an optimal, or desired, location of overlay features and, therefore, the pattern on patterned devices 20. This information may be obtained from an existing reference patterned device (not shown) that may be employed as a standard against which patterned device 20 is measured. Alternatively, reference information 82 may be obtained from a GDS file that is employed to form the pattern on patterned device 20. Considering that errors, or distortion, in the pattern on the patterned device 20 may be attributed to the writing and etch processes used to form patterned device 20, computer data of the type employed in computer aided design software may provide reference information 82 with the most accurate reflection of the optimal pattern. Exemplary computer data is that employed by CATS™ software sold by Synopsis, Inc., of Mountain View, Calif.

Figure 5:
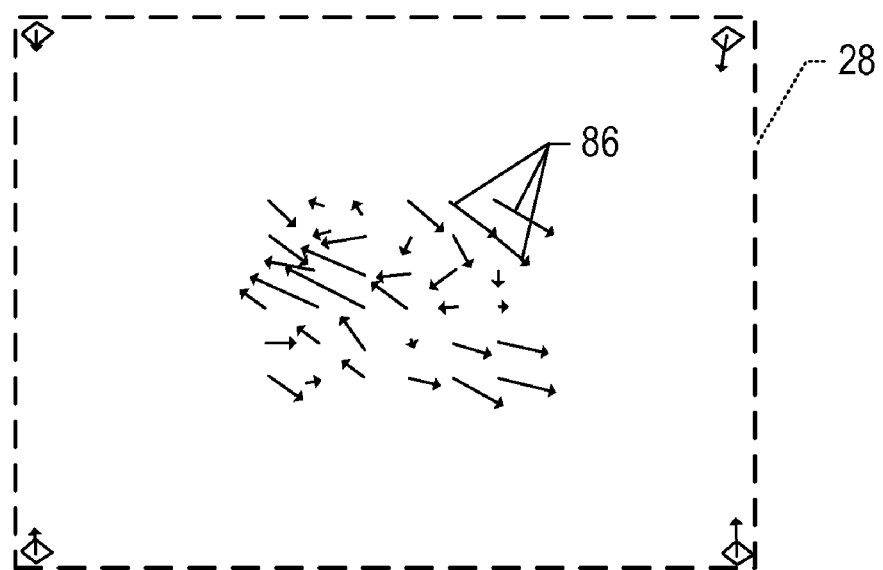
FIG. 5 is a simplified plan view showing distortion vectors determined in accordance with the present invention.

Referring to FIGS. 3 and 5, also stored in memory 60 is a routine 84 that facilitates comparison of measured information 78 with reference information 82. Routine 84 includes X and Y positional variations between features in measured information 78 with respect to corresponding features in reference information 82 and generates image placement variation data shown in below in Table 1:

TABLE 1

| | Image Placement Variation | |
|---|---|---|
| Point | X (μm) | Y (μm) |
| 1 | 0.01 | −0.012 |
| 2 | 0 | −0.003 |

TABLE 1-continued

Image Placement Variation

| Point | X (μm) | Y (μm) |
|---|---|---|
| 3 | −0.003 | −0.001 |
| 4 | 0.013 | −0.013 |
| 5 | 0.016 | −0.016 |
| 6 | 0.018 | −0.014 |
| 7 | 0.012 | −0.012 |
| 8 | −0.001 | −0.001 |
| 9 | −0.012 | −0.004 |
| 10 | −0.001 | −0.007 |
| 11 | 0.005 | −0.014 |
| 12 | 0.009 | −0.013 |
| 13 | −0.004 | −0.004 |
| 14 | −0.017 | 0.005 |
| 15 | −0.02 | 0.01 |
| 16 | −0.01 | −0.002 |
| 17 | −0.007 | −0.008 |
| 18 | 0 | −0.007 |
| 19 | −0.008 | 0.007 |
| 20 | −0.022 | 0.013 |
| 21 | −0.024 | 0.017 |
| 22 | −0.011 | 0.012 |
| 23 | −0.005 | 0 |
| 24 | 0.001 | 0 |
| 25 | 0.01 | −0.001 |
| 26 | −0.006 | 0.006 |
| 27 | −0.006 | 0.012 |
| 28 | 0.003 | 0 |
| 29 | 0.012 | −0.006 |
| 30 | 0.016 | −0.005 |
| 31 | 0.011 | −0.01 |
| 32 | 0.002 | −0.001 |
| 33 | −0.005 | 0.004 |
| 34 | 0.011 | −0.003 |
| 35 | 0.016 | −0.011 |
| 36 | 0.019 | −0.006 |

From the data in Table 1, distortion vectors 86 are generated. Distortion vectors 86 are vectorized representations of the differences in spatial location of the overlay features associated with measured information 78 with respect to corresponding overlay features associated with reference information 82. As a result, distortions vectors 86 comprise data 88, mapped into memory 60, concerning a set of spatial locations 90 of features of the pattern on patterned device 20. An exemplary distortion vector 86 generated from image placement variation data would be mapped into memory as a series starting with feature 1 and ending with feature 36 as identifying the x and y variations of each of the features as follows: {0.01, −0.012, 0, −0.003, . . . 0.019, and −0.006}.

Distortion vectors 86 may further represent, inter alia, magnification errors, orthogonal errors, and other errors.

Spatial locations 90 represent the spatial location of the overlay features on patterned device 20. Data 88 includes directional and magnitude characteristics of the differences between measured information 78 and reference information 82. Specifically, data 88 includes information concerning the distance, along two orthogonal axes, between spatial locations 90 of each of the overlay features on patterned device 20 with respect to spatial locations of the corresponding overlay feature of the optimal/desired pattern.

To that end, actuator system 62 facilitates alignment and overlay registration by selectively deforming patterned device 20 by applying forces upon patterned device 20 by actuators 64. The forces upon patterned device 20 by actuators 64 must satisfy the following equilibrium and moment conditions:

$$\Sigma F_x = 0; \quad (1)$$

$$\Sigma F_y = 0; \text{ and} \quad (2)$$

$$\Sigma M_z = 0; \quad (3)$$

where $F_x$ are forces in the x direction, $F_y$ are forces in the y direction and $M_z$ are moments about the z axis. To that end, equations (1), (2), and (3) may be modeled as follows:

$$[K] \times \{f\} = \{0\} \quad (4)$$

Matrix [K] may be determined by the spatial relationship between actuators 64 and patterned device 20. In the present example, $$[K] = \begin{bmatrix} x1 & x2 & x3 & x4 & x5 & x6 & x7 & x8 & x9 & x10 & x11 & x12 & x13 & x14 & x15 & x16 \\ y1 & y2 & y3 & y4 & y5 & y6 & y7 & y8 & y9 & y10 & y11 & y12 & y13 & y14 & y15 & y16 \\ m1 & m2 & m3 & m4 & m5 & m6 & m7 & m8 & m9 & m10 & m11 & m12 & m13 & m14 & m15 & m16 \end{bmatrix} \quad (5)$$

where $x_i$, $y_i$, and $m_i$ are the coefficients of $f_i$ in equations (1), (2), and (3), respectively. To that end, in the present example, the matrix [K] may be defined as follows:

$$[K] = \begin{bmatrix} 1 & 1 & 1 & 1 & 0 & 0 & 0 & 0 & -1 & -1 & -1 & -1 & 0 & 0 & 0 & 0 \\ 0 & 0 & 0 & 0 & 1 & 1 & 1 & 1 & 0 & 0 & 0 & 0 & -1 & -1 & -1 & -1 \\ -3 & -1 & 1 & 3 & -3 & -1 & 1 & 3 & -3 & -1 & 1 & 3 & -3 & -1 & 1 & 3 \end{bmatrix}$$

The force vector {f} is the forces associated with actuators 64. In the present example, the force vector {f} may be defined as follow:

$$\{f\} = \{f1, f2, f3, f4, f5, f6, f7, f8, f9, f10, f11, f12, f13, f14, f15, f16\}^T \quad (7)$$

where f1 is the force associated with actuator 64a; f2 is the force associated with actuator 64b; f3 is the force associated with actuator 64c; f4 is the force associated with actuator 64d; f5 is the force associated with actuator 64e; f6 is the force associated with actuator 64f; f7 is the force associated with actuator 64g; f8 is the force associated with actuator 64h; f9 is the force associated with actuator 64i; f10 is the force associated with actuator 64j; f11 is the force associated with actuator 64k; f12 is the force associated with actuator 64l; f13 is the force associated with actuator 64m; f14 is the force associated with actuator 64n; f15 is the force associated with actuator 64o; and f16 is the force associated with actuator 64p.

To that end, from equation (4), the nullspace basis vectors may be determined. In the present example, there are 16 independent forces from actuators 64 and there are 3 equilibrium conditions, resulting in 13 independent force vectors. To that end, employing equations (6) and (7) with equation (4), the orthonormal basis of the matrix [K] may be determined using well-known linear algebraic methods and may be defined as follows:

$$[nK] = \begin{bmatrix} 1 & 2 & 1 & 2 & 3 & -2 & -1 & 0 & 1 & 3 & -2 & -1 & 0 \\ -2 & -3 & -1 & -2 & -3 & 3 & 2 & 1 & 0 & 3 & 2 & 1 & 0 \\ 1 & 0 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 & 0 \\ 0 & 0 & -1 & -1 & -1 & 0 & 0 & 0 & 1 & 1 & 1 & 1 & 1 \\ 0 & 0 & 1 & 0 & 0 & 0 & 0 & 0 & 0 & 0 & 0 & 0 & 0 \\ 0 & 0 & 0 & 1 & 0 & 0 & 0 & 0 & 0 & 0 & 0 & 0 & 0 \\ 0 & 0 & 0 & 0 & 1 & 0 & 0 & 0 & 0 & 0 & 0 & 0 & 0 \\ 0 & 0 & 0 & 0 & 0 & 1 & 0 & 0 & 0 & 0 & 0 & 0 & 0 \\ 0 & 0 & 0 & 0 & 0 & 0 & 1 & 0 & 0 & 0 & 0 & 0 & 0 \\ 0 & 0 & 0 & 0 & 0 & 0 & 0 & 1 & 0 & 0 & 0 & 0 & 0 \\ 0 & 0 & 0 & 0 & 0 & 0 & 0 & 0 & 1 & 0 & 0 & 0 & 0 \\ 0 & 0 & 0 & 0 & 0 & 0 & 0 & 0 & 0 & 1 & 0 & 0 & 0 \\ 0 & 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 0 & 1 \end{bmatrix} \quad (8)$$

To that end, each column of the matrix [nK] is an independent force vector and may be referred to as $\lambda_1, \lambda_2, \ldots, \lambda_{13}$.

Force vectors $\lambda_1, \lambda_2, \ldots, \lambda_{13}$ may be referred to as the nullspace basis vectors of equation (4). More specifically, the matrix [nK] may be defined as follows:

$$[nK]_{16 \times 13} = [\lambda_1, \lambda_2, \lambda_3, \lambda_4, \lambda_5, \lambda_6, \lambda_7, \lambda_8, \lambda_9, \lambda_{10}, \lambda_{11}, \lambda_{12}, \lambda_{13}, \lambda_{14}, \lambda_{15}, \lambda_{16}] \quad (9)$$

As a result, any force vector {f} may be defined as follow:

$$\{f\} = \{p_1\lambda_1 + p_2\lambda_2 + p_3\lambda_3 + p_4\lambda_4 + p_5\lambda_5 + p_6\lambda_6 + p_7\lambda_7 + p_8\lambda_8 + p_9\lambda_9 + p_{10}\lambda_{10} + p_{11}\lambda_{11} + p_{12}\lambda_{12} + p_{13}\lambda_{13} + p_{14}\lambda_{14} + p_{15}\lambda_{15} + p_{16}\lambda_{16}\} \quad (10)$$

wherein $p_1, p_2, p_3, p_4, p_5, p_6, p_7, p_8, p_9, p_{10}, p_{11}, p_{12}, p_{13}, p_{14}, p_{15}$, and $p_{16}$ are the scalar coefficients of $\lambda_1, \lambda_2, \lambda_3, \lambda_4, \lambda_5, \lambda_6, \lambda_7, \lambda_8, \lambda_9, \lambda_{10}, \lambda_{11}, \lambda_{12}, \lambda_{13}, \lambda_{14}, \lambda_{15}$, and $\lambda_{16}$, respectively.

Referring to FIGS. 3 and 5, to that end, processor 58 operates on routine 84 to process data concerning distortion vectors 86 and generate signals that are sensed by actuators 64 to selectively deform patterned device 20 and attenuate, if not abrogate, differences between measured information 78 and reference information 82, thereby minimizing overlay variations between the pattern on patterned device 20 with respect to the optimal/desired pattern. The distance between the overlay features associated with measured information 78 from the corresponding overlay features associated with reference information 82 is minimized by creating translational movement of spatial locations 90. To that end, routine 84 determines the loads to be applied by actuators 64 in order to selectively deform patterned device 20 solving an inverse transform function as follows:

$$[A]\{p\} = \{u\}, \quad (11)$$

where [A] represents the compliance matrix to be specified for patterned device 20; {p} comprises weighting coefficients for the force vectors $\lambda_1, \lambda_2, \ldots, \lambda_{13}$; and {u} represents spatial translation of features associated with measured information 78 must undergo in order to match the spatial location of the corresponding feature in reference information 82, i.e., {u} represents an additive inverse of the distortion vectors 86.

One manner in which to determine the compliance matrix [A] employs finite element analysis (FEA). To that end, an FEA model of patterned device 20, referred to as modeled device 96 is generated and stored in memory 60, using any known modeling technique, such as software sold under the trade name Pro/Engineer™ 2001 and finite element solver software sold under the trade name Pro/Mechanica™ 2001.

Employing FEA, obtained are measurements of the spatial displacement of each of a plurality of data points 98 of the modeled device 96 in response to simulated loading of force vectors $\lambda_i$ by actuators 64. Data points 98 represent the spatial location of the overlay features of the pattern on modeled device 96. To obtain useful information, the overlay features with which data points 98 are associated correspond to same features of patterned device 20 that are associated with spatial locations 90. In the present example, each of data points 98 is associated with one of spatial locations 90, such that each of data points 98 corresponds to one of spatial locations 90 that differs from the spatial locations 90 associated with the remaining data points 98. Once compliance matrix [A] is determined, vector {p} is determined from equation (11), and thus force vector {f} is determined from equation (10). Signals are generated by processor 58 to cause actuators 64 to apply the requisite loads to patterned device 20 that are a function of the force vector {f}. In this fashion, distortions in the patterned device 20 are minimized, if not abrogated.

For each of data points 98 a displacement along the x and y axes may be defined as follows:

$$X_n = p_1 x_{1n} + p_2 x_{2n} + \ldots + p_m x_{mn}; \text{ and} \tag{12}$$

$$Y_n = p_1 y_{1n} + p_2 y_{2n} + \ldots + p_m y_{mn}; \tag{13}$$

where $p_i$ is the scalar co-efficient from force vector $\lambda_i$, n denotes the data point and $x_{in}$, $y_{in}$ represents the movement of a data point n along x, y directions in terms of millimeters/ Newtons in response to loading with force vector $\lambda_i$. In the present example, n is an integer from 1 to 4 and i is an integer from 1 to 8. An exemplary compliance matrix [A] based upon the conditions set forth in equations 1-3 and 12-13 for 4 overlay features is as follows:

$$A = 1e-5 \times \begin{bmatrix} -0.0350 & -0.3316 & -0.6845 & -0.4965 & 0.4924 & 0.2550 & 0.2025 & -0.5387 \\ 0.4923 & 0.2551 & 0.2028 & -0.5388 & -0.0349 & -0.3316 & -0.6845 & -0.4957 \\ 0.0311 & 0.3313 & 0.6848 & 0.4965 & 0.5387 & -0.2034 & -0.2557 & -0.4926 \\ 0.4930 & 0.2550 & 0.2026 & -0.5389 & -0.4989 & -0.6846 & -0.3310 & -0.0323 \\ -0.4992 & -0.6846 & -0.3310 & -0.0329 & 0.4931 & 0.2549 & 0.2025 & -0.5388 \\ 0.5385 & -0.2033 & -0.2556 & -0.4925 & 0.0313 & 0.3313 & 0.6848 & 0.4973 \\ 0.4938 & 0.6847 & 0.3318 & 0.0333 & 0.5393 & -0.2036 & -0.2560 & -0.4925 \\ 0.5393 & -0.2034 & -0.2559 & -0.4927 & 0.4941 & 0.6846 & 0.3319 & 0.0338 \end{bmatrix} \tag{14}$$

Knowing compliance matrix [A], routine 84 may determine the magnitude of the forces to be generated {f} by actuators by solving for {p}. Specifically, routine 84 solves the force vector {p} from equation (11) as follows:

$$\{p\} = [A]^{-1}\{u\}, \tag{15}$$

were [A] a square matrix. Were [A] not a square matrix, equation (15) is expressed as follows:

$$\{p\} = \{A^T A\}^{-1} A^T \{u\}, \tag{16}$$

where $A^T$ is the transpose matrix of compliance matrix [A]. To solve for {p} over the infinity norm, equation (11) may be reforumulated as follows:

$$[A]\{p\} - \{u\} = \{e\}. \tag{17}$$

Hence the problem becomes finding {p} such that the error vector {e} is minimized. [A] is the compliance matrix described above. Routine 84 may minimize the error vector {e} over the infinity norm given by the following:

$$\max(|[A]\{p\} - \{u\}|) \tag{18}$$

The reason for selecting to minimize the infinity norm is that it is believed that the magnitude of the absolute value of overlay error that determines a pattern layer's usefulness. As mentioned above, the maximum overlay error is believed to be less than $\frac{1}{3}^{rd}$ the minimum feature size of the pattern, for the pattern layer to be functional. Hence, it is desired to have routine 84 minimize this maximum absolute error, i.e., the infinity norm as follows:

$$\text{Min}(\max |[A]\{p\} - \{u\}|). \tag{19}$$

Objective function (19) is convex piecewise linear in terms of the decision variables, i.e. $p_i$. A convex piecewise linear function is, by definition, non-linear. The domain of differences among the set may, therefore, include several local minima. To that end, routine 84 may be required to undertake several iterations with a range of trial/guess starting vectors and to implement a directional search routine. A typical iterative procedure in accordance with the present invention commences from an initial point where a function value is calculated. The procedure proceeds to solutions in which the function has lower values. This results in routine 48 computing information concerning the function until convergence is identified. Routine 48 ends the procedure at a minimum value where no further reduction in the functional value is identified within the tolerance.

Any known iterative directional search techniques like Newton-Raphson Methods, Conjugate Gradient methods, Quasi-Newton Methods may be employed to get the optimum {p}. One manner in which to implement these techniques is with Microsoft EXCEL, stored in memory 60 and operated on by processor 40 using standard operating systems such as WINDOWS®, available from Microsoft Corporation. The data obtained from the finite element analysis, discussed above, is collated in a matrix form and entered, and the appropriate relationships between the matrices are established, e.g., in accordance with equation (11).

One manner in which to improve the calculation of {p} is by converting the non-linear formulation (19) into a linear problem. To that end, equation (17) is substituted into equation (19). This allows routine 84 to express equation (19) for the series of data 88, as follows:

$$\text{Minimize}(\text{Maximum } (|e_1|, |e_2| \ldots |e_n|)), \tag{20}$$

where, $e_i$ are the elements of error vector {e}. By routine 84 expanding equation (20), obtained is the following:

$$\text{Minimize}(\text{Maximum } (e_1, -e_1, e_2, -e_2, \ldots e_n, -e_n)). \tag{21}$$

By routine 84 substituting a variable w for (Maximum $e_1$, $-e_1$, $e_2$, $-e_2$, ..., $e_n$, $-e_n$), equation (21) may be defined as follows:

$$\text{Minimize }(w). \tag{22}$$

Providing the following constraints:

$$w \geq e_i \tag{23}$$

$$w \geq -e_i. \tag{24}$$

That is, routine 84 may solve non-linear equation (19) formulated as equation (22) with the following constraints:

$$w \geq [A]\{p\} - \{u\}; \text{ and} \tag{25}$$

$$w \geq \{u\} - [A]\{p\}. \tag{26}$$

An advantage with reformulating equation (19) as a linear problem is that the linear problem is likely to converge to the global minimum in a finite number of steps, under pseudo-polynomial algorithms like the Simplex method. This minimizes the computational power required to have routine 84 determine the global minimum. Iterative search techniques can however still be used. Also, most often non-linear programming techniques converge to the local optima, unless careful checks are implemented. This was noticed to happen when EXCEL tried to solve the non-linear problem. As a result, reformulated equation (19) as a linear problem facilitates obtaining the minimum among the set of data 88 while minimizing the computational power required.

Referring to FIGS. 6-8, patterned device 20 is shown. To that end, it may be desired for patterned device 20 to have dimensions to facilitate magnification and distortion thereof, with the dimensions for geometric parameters of patterned device 20 shown below in Table 2.

TABLE 2

Geometric Specifications for Patterned Device

| Geometric Parameter | Target | Tolerance |
|---|---|---|
| $L_1$ | 64.95 mm | ±0.05 |
| $L_2$ | 64.95 mm | ±0.05 |
| $Q_1$ | 90° | ±1E−3 Radians |
| $Q_2$ | 0° | ±1E−3 Radians |
| $W_1$ | 0.4 mm | ±0.2 mm |
| $W_2$ | 0.4 mm | ±0.2 mm |
| $d_1$-$d_2$ | 0 mm | ±0.05 mm |
| $d_3$-$d_3$ | 0 mm | ±0.05 mm |
| T | 6.35 mm | ±0.1 mm |
| R | 1.5 mm | ±1 mm |

The geometric parameters may be defined as follows: L1 may be defined between side 70 and 74; L2 may be defined between side 72 and 76; Q1 may be defined as the angle between any two sides of sides 70, 72, 74, and 76; Q2 may be defined as the angle between any side of sides 70, 72, 74, and 76 and a plane 100 perpendicular to a plane 102 in which patterned device 20 lays; w1 may be defined as the width of a first edge surface 106 defined between first surface 20 and a side of sides 70, 72, 74, and 76; w2 may be defined as the width of a second edge surface 108 defined between second surface 22 and a side of sides 70, 72, 74, and 76; d1-d4 may be defined between mold 24 and a side of sides 70, 72, 74, and 76; T may be defined as the thickness of template 18 between first and second opposed sides 20 and 22; and R may be defined as the radius of curvature of template 18 between any two sides of sides 70, 72, 74, and 76.

The embodiments of the present invention described above are exemplary. Many changes and modifications may be made to the disclosure recited above, while remaining within the scope of the invention. For example, the method described above is discussed with respect to attenuating, if not eliminating overlay error resulting from both image placement and other characteristics, such as magnification, orthogonality and trapezoidal errors in the case of imprint lithography. Were magnification, orthogonality and/or trapezoidal not present or corrected by other methods, for example in the case of optical lithography, the invention described above can be used to minimize the uncorrected overlay errors. The scope of the invention should, therefore, not be limited by the above description, but instead should be determined with reference to the appended claims along with their full scope of equivalents.

What is claimed is:

1. A method for determining deformation parameters that a patterned device would undergo to minimize dimensional variations between a recorded pattern thereon and a reference pattern, said method comprising:

comparing spatial variations between features of said recorded pattern with respect to corresponding features of said reference pattern;

generating distortion vectors from location differences between said features in said recorded pattern and said corresponding features of said reference pattern; and determining deformation forces from said distortion vectors to apply to said patterned device to attenuate said dimensional variations, with said forces having predetermined constraints, wherein a summation of a magnitude of said forces is substantially zero and a summation of moment of said forces is substantially zero.

2. The method as recited in claim 1 wherein said patterned device lies in a plane having a first and a second axis, said first axis being orthogonal to said second axis, with said summation of said magnitude of said forces being substantially zero with respect to said first and second axis and a summation of said moment of said forces is substantially zero with respect to a third axis, said third axis being orthogonal to said first and said second axis.

3. The method as recited in claim 1 wherein said patterned device comprises first and second opposed sides and third and fourth opposed sides, with a distance between said first and second opposed sides and a distance between said third and further opposed sides having a predetermined magnitude with a tolerance of 0.05 mm.

4. The method as recited in claim 3 wherein an angle between any two sides of said first, second, third, and fourth sides has a predetermined magnitude with a tolerance of 1E-3 Radians.

5. The method as recited in claim 4 wherein said patterned device comprises fifth side, said fifth side being orthogonal to said first, second, third, and fourth sides, said patterned device further comprising an edge surface between said fifth side and said first, second, third, and fourth sides, with a width of said edge surface having a predetermined magnitude with a tolerance of 0.2 mm.

\* \* \* \* \*